United States Patent [19]

Akoh et al.

[11] Patent Number: 4,737,416
[45] Date of Patent: Apr. 12, 1988

[54] FORMATION OF COPPER ELECTRODE ON ALUMINUM NITRIDE

[75] Inventors: Tetsuo Akoh; Hiroshi Tsuyuki; Toshihiro Suzuki; Kentaro Sawamura, all of Tokyo, Japan

[73] Assignee: TDK Corporation, Tokyo, Japan

[21] Appl. No.: 831,455

[22] Filed: Feb. 20, 1986

[30] Foreign Application Priority Data

Feb. 26, 1985 [JP] Japan .................................. 60-37133

[51] Int. Cl.$^4$ ............................................. B05D 3/02
[52] U.S. Cl. ................................... 428/469; 204/37.1; 204/38.4; 427/96; 427/98; 427/123; 427/124; 427/383.3
[58] Field of Search ....................... 204/30, 37.1, 38.1, 204/38.4; 427/96, 98, 123, 124, 377, 383.3, 383.5; 428/469

[56] References Cited

U.S. PATENT DOCUMENTS

| 4,259,409 | 3/1981 | Arnold | 428/428 |
|---|---|---|---|
| 4,281,041 | 7/1981 | Koehler | 428/336 |
| 4,342,632 | 8/1982 | Heim et al. | 204/192 EC |
| 4,428,986 | 1/1984 | Schachameyer | 427/309 |
| 4,569,902 | 2/1986 | Saito | 430/313 |
| 4,647,477 | 3/1987 | DeLuca | 427/98 |

OTHER PUBLICATIONS

F. A. Lowenheim, Electroplating, McGraw-Hill Book Co., New York, 1978, pp. 59-60.
J. L. Vossen et al, Thin Film Processes, Academic Press, New York, 1978, pp. 14-18, 210-212.

Primary Examiner—John F. Niebling
Assistant Examiner—W. T. Leader
Attorney, Agent, or Firm—Oblon, Fisher, Spivak, McClelland & Maier

[57] ABSTRACT

A copper electrode is firmly bonded to a sintered aluminum nitride body by applying a copper film on a sintered aluminum nitride body by electroless or electrolytic plating, evaporation or sputtering, and heat treating the copper film on the body at a temperature of 900° to 1083° C. in a weakly oxidizing atmosphere.

13 Claims, No Drawings

FORMATION OF COPPER ELECTRODE ON ALUMINUM NITRIDE

BACKGROUND OF THE INVENTION

This invention relates to the formation of a copper electrode on aluminum nitride, especially on a sintered aluminum nitride body.

Aluminum nitride has an about five-fold greater thermal conductivity than alumina and sintered aluminum nitride bodies are well known to have the great advantages of excellent thermal conductivity and low coefficient of thermal expansion. It is expected that the sintered aluminum nitride bodies having such advantages can be metallized such that they are useful as various structural materials and electronic part-supporting materials including circuit boards requiring heat dissipation capacity, silicon chip protecting discs for power transistors and integrated circuits, and packages for power transistors and integrated circuits.

Unfortunately, it is generally difficult to bond metal with aluminum nitride. A number of bonding methods were proposed, for example, a thick film method wherein metal paste is applied and a method as disclosed in Japanese Patent Application Kokai No. 59-121175 wherein a sintered aluminum nitride body is surface treated before metallizing is carried out. The metallized bodies by these methods are often insufficient in bond strength between aluminum nitride and metal. In the method disclosed in Japanese Patent Application Kokai No. 59-121175, an oxide film is formed on a sintered aluminum nitride body during surface treatment to adversely affect the thermal conductivity thereof. These products were thus used in limited applications.

SUMMARY OF THE INVENTION

A primary object of the present invention is to provide a novel and improved method for forming a copper electrode on aluminum nitride in a simple and economic manner in high yields wherein the resulting metallized body exhibits improved bond strength between aluminum nitride and copper and high electric conductivity, and finds a wide range of applications.

The present invention is directed to a method for forming a copper electrode on a sintered aluminum nitride body. According to the present invention, a copper film is applied onto a sintered aluminum nitride body by wet or vapor plating. The copper film on the body is then heat treated at a temperature of 900° to 1083° C. in a weakly oxidizing atmosphere.

DETAILED DESCRIPTION OF THE INVENTION

Briefly stated, according to the present invention, a copper electrode is formed on a sintered aluminum nitride body by applying a copper film onto the sintered body by wet plating or vapor plating and then heat treating the assembly.

The wet plating may be carried out as follows, for example.

A sintered aluminum nitride body is degreased in a 10% NaOH aqueous solution, etched with mixed acid solution containing HF, sensitized with a sensitizing agent such as $SnCl_2$, surface activated with an activator such as $PdCl_2$, and then subjected to electroless plating in a solution containing $CuSO_4$, ethylenediaminetetraacetic acid (EDTA), formalin, NaOH, etc. If necessary, additional electrolytic plating may be carried out in a $CuSO_4$ bath in order to increase the thickness of the plating layer to the desired value. The thus plated body is cleaned and dried.

Typical of the vapor plating for applying copper to aluminum nitride are vacuum deposition and sputtering of copper. The vapor plating may also be followed by an additional electrolytic plating if desired.

The thus applied copper films generally have a thickness of about 0.5 to 20 $\mu$m.

The application of copper film is followed by a heat treatment at a temperature of 900° to 1083° C., and preferably 900° to 1065° C. Temperatures lower than 900° C. are difficult to achieve the desired bond strength and likely to oxidize copper. Copper is melted at temperatures in excess of 1083° C., the melting point of copper. At temperatures between 1065° C. and 1083° C., a bond is readily accomplished, but copper becomes liable to induce "blister" defects as it is considerably softened.

The heat treatment should be carried out in a weakly oxidizing atmosphere which may be an inert gas atmosphere having an oxygen concentration $P_{O2}$ of 1 to 30 ppm, and preferably 4 to 10 ppm. Oxygen concentrations of less than 1 ppm are too low to allow oxidation reaction from Cu to $Cu_2O$ to take place to form a composite oxide with Al of the aluminum nitride, thus failing to achieve a bond strength. Copper is too excessively oxidized to serve as an electrode at oxygen concentrations of higher than 30 ppm. Some illustrative, non-limiting examples of the inert gases include nitrogen, argon, and neon.

The heating time depends on the heat treating temperature and may be more than about 5 hours at temperatures of 900° to 950° C., more than about 1 hour at temperatures of 950° to 1065° C., and about 10 minutes at temperatures of 1065° to 1083° C. with the likelihood of inducing blister defects in copper film. The most preferred heat treating conditions are more than about 1 hour at temperatures of 950° to 1065° C.

Although the present invention is not restricted by the theory, it is believed that the bond between aluminum nitride (AlN) and copper (Cu) results from formation of a composite oxide in the form of $CuAlO_2$ at the interface with AlN. When a copper film is applied by wet or vapor plating, the contact area between Cu and AlN is microscopically greater while the inter-atomic contact distance between Cu and AlN is relatively short. This enables formation and interposition of $CuAlO_2$ by solid-phase reaction so that a firm bond is obtained even when the heating temperature is lower than 1065° C., the Cu-O eutectic temperature.

The sintered AlN bodies which can be used in the practice of the present invention may be readily available or prepared by such methods as disclosed in the following Japanese Patent Applications:

No. 59-215971,
No. 59-265852,
No. 59-265853,
No. 59-265854,
No. 59-265855, and
No. 59-265956.

Usually, sintering aids such as $CaB_6$ are added to aluminum nitride powder in amounts of 0.01 to 10% by weight and mixed until a substantially uniform mixture is obtained. The mixture is shaped into a compact and then fired in a non-oxidizing atmosphere.

Sintered aluminum nitride bodies are thus obtained and used as substrates for metallization of copper. A Cu electrode may be formed on the AlN substrate.

According to the present invention, a copper electrode is formed on a sintered aluminum nitride body by applying a copper film on the body by wet or vapor plating and effecting heat treatment at a temperature of 900 to 1083° C. in a weakly oxidizing atmosphere. The thus metallized body exhibits an increased bond strength between aluminum nitride and copper. The metallizing process is simple, easy and amenable to mass production. Since copper itself is highly electroconductive and inexpensive, the products have many advantages including electrical properties and economy. The products are thus useful as various structural materials and electronic part-supporting materials, for example, circuit boards requiring good heat dissipation.

In order that those skilled in the art will better understand how to practice the present invention, examples are given below by way of illustration and not by way of limitation.

EXAMPLES

A mixture was prepared by adding 0.1% by weight of $CaB_6$ powder having a mean particle size of 10 μm to AlN powder having a mean particle size of 5 μm and thoroughly milling them. The mixture was shaped into a compact at room temperature and a pressure of about 1,000 kg/cm$^2$. The compact was heated up to 1750° C. in a nitrogen stream, kept at the temperature for one hour, and then furnace cooled.

The sintered AlN body thus obtained of 20 mm by 20 mm by 0.6 mm thick was degreased in 10% NaOH aqueous solution, etched with a mixed acid solution containing 10% of HF and 20% of $HNO_3$, and sensitized with $SnCl_2$. The body was activated with $PdCl_2$ and then subjected to electroless copper plating in a bath containing $CuSO_4$, EDTA, formalin, NaOH, and a stabilizer.

The body was further subjected to electrolytic plating in a $CuSO_4$ bath until the copper plating reached a total thickness of about 7 μm, and subsequently cleaned and dried.

The wet-plated body was heat treated under conditions as indicated for temperature, atmosphere, and time in Table 1. A series of samples were prepared in accordance with the above procedure.

A comparative sample was also prepared by repeating the procedure except the heat treatment of copper film.

Additional comparative samples were prepared by applying a Cu paste (ESL #2311, fritless type) and another Cu paste (ZnO base frit) onto AlN bodies, respectively, followed by a suitable heat treatment.

Further comparative samples were prepared by plating copper onto SiC and $Si_3N_4$ bodies followed by heat treatment.

All the copper films formed on these samples had dimensions of 2 mm by 2 mm by 5-8 μm thick.

The samples were examined for bond strength by the following test.

Bond Strength Test

A copper wire having a diameter of 0.8 mm was extended parallel to one edge of the applied copper film and soldered to the film over the overlapped area. The wire extending from the soldered area was pulled by means of a tensile tester in a direction substantially perpendicular to the applied copper film interface so as to separate the copper film from the substrate. The load at which the film was separated from the substrate was recorded.

The results are shown in Table 1.

TABLE 1

| Sample No. | Sintered body | Copper application | Heat Treatment Temperature (°C.) | $P_{O_2}$ (ppm in $N_2$) | Time (hr) | Bond strength (kg) |
|---|---|---|---|---|---|---|
| 101* | AlN | Plating | — | — | — | 0.5 |
| 102 | AlN | Plating | 900 | 6-7 | 5 | 1.4 |
| 103 | AlN | Plating | 1000 | 6-7 | 1 | 3.2 |
| 104 | AlN | Plating | 1000 | 6-7 | 2 | 3.9 |
| 105 | AlN | Plating | 1000 | 6-7 | 5 | 5.1 |
| 106 | AlN | Plating | 1000 | 1 | 5 | 2.1 |
| 107* | AlN | Plating | 1000 | <1 | 5 | 0.5 |
| 108* | AlN | Plating | 1000 | 100 | 5 | cannot solder due to Cu oxidation |
| 109 | AlN | Plating | 1070 | 6-7 | 10 min. | 2.4 |
| 110 | AlN | Plating | 1070 | 6-7 | 1 | 4.7 |
| 111* | AlN | Paste ESL #2311 | 1000 | 6-7 | 5 | 0.3 minute blisters |
| 112* | AlN | Paste ZnO frit | 1000 | 6-7 | 5 | 0.2 |
| 113* | SiC | Plating | 1070 | 6-7 | 1 | 0.4 |
| 114* | $Si_3N_4$ | Plating | 1070 | 6-7 | 1 | 0.5 |

*comparative examples

As seen from the data in Table 1, those samples prepared by appling a copper film onto aluminum nitride by wet electroless plating and heat treating at 900° to 1083° C. in a weakly oxidizing atmosphere displayed an increased Cu-AlN bond strength. The Cu paste coating failed to achieve a sufficient bond strength even under the same heat treating conditions. The copper plating-/heat treating process conforming to the present invention failed to achieve a sufficient bond strength when applied to SiC and $Si_3N_4$ substrates.

Additional samples were prepared by repeating the procedure for sample Nos. 101-110, 113, and 114 except that the wet plating was replaced by vapor plating, specifically vacuum deposition or evaporation to apply copper on AlN substrates. A bond strength test was carried out on these samples to find that equivalent results were obtained.

These data prove the effect of the present invention.

We claim:

1. A method for forming a copper electrode on a sintered aluminum nitride body, comprising:

(a) applying a copper film on a sintered aluminum nitride body by wet electroless plating or vapor plating, and
(b) heat treating the copper film on the body at a temperature of about 900° to 1083° C. in an inert gas atmosphere having an oxygen concentration of about 1 to 30 ppm of oxygen.

2. The method of claim 1 wherein the copper film is formed by electroless plating followed by electrolytic plating.

3. The method of claim 1 wherein the copper film is formed by vacuum deposition or sputtering.

4. The method of claim 1 wherein the copper film is formed by vacuum deposition or sputtering followed by electrolytic plating.

5. The method of claim 1 wherein the heat treatment is carried out at a temperature of 900° to 1065° C.

6. The method of claim 5 wherein the heat treatment is carried out for about one hour or more.

7. The method of claim 1, wherein said heat treatment comprises heating the copper film at a temperature of about 950° to 1065° C. for at least one hour.

8. The method of claim 1 wherein the atmosphere is an inert gas atmosphere containing 4 to 10 ppm of oxygen.

9. The method of claim 1, wherein said applied copper film has a thickness of about 0.5 to 20 μm.

10. An article of manufacture, comprising a sintered aluminum nitride body and a copper film electrode formed thereon, said article being prepared by a method comprising:
(a) applying a copper film on a sintered aluminum nitride body by wet electroless plating or vapor plating, and
(b) heat treating the copper film on the body at a temperature of about 900°–1083° C. in an inert gas atmosphere having an oxygen concentration of about 1 to 30 ppm of oxygen.

11. The article of claim 10 wherein the copper film has a thickness of about 0.5 to 20 μm.

12. The article of claim 10, wherein said heat treatment is effected in an inert gas atmosphere having an oxygen concentration of about 4 to 10 ppm.

13. The article of claim 10, wherein said heat treatment comprises heating the copper film at a temperature of about 950° to 1065° C. for at least one hour.

* * * * *